United States Patent [19]

Ueda et al.

[11] Patent Number: 4,489,340

[45] Date of Patent: Dec. 18, 1984

[54] PNPN LIGHT SENSITIVE SEMICONDUCTOR SWITCH WITH PHOTOTRANSISTOR CONNECTED ACROSS INNER BASE REGIONS

[75] Inventors: Jun Ueda; Haruo Mori; Kazuo Hagimura; Hirokazu Tsukada; Kotaro Kato, all of Tokyo, Japan

[73] Assignees: Nippon Telegraph & Telephone Public Corporation; Oki Electric Industry Co., Ltd., both of Tokyo, Japan

[21] Appl. No.: 228,935

[22] Filed: Jan. 28, 1981

[30] Foreign Application Priority Data

Feb. 4, 1980 [JP] Japan .................................. 55-11472
Feb. 4, 1980 [JP] Japan .................................. 55-11473

[51] Int. Cl.³ .......................................... H01L 29/74
[52] U.S. Cl. .................................... 357/38; 357/30; 357/51; 357/59; 357/86; 357/23
[58] Field of Search ....................... 357/38, 51, 23, 43, 357/41, 30, 86; 307/252 G

[56] References Cited

U.S. PATENT DOCUMENTS 4,224,634 9/1980 Suedberg .............................. 357/38
4,244,000 1/1981 Ueda et al. ............................ 357/38

Primary Examiner—Joseph E. Clawson, Jr.
Attorney, Agent, or Firm—Wenderoth, Lind & Ponack

[57] ABSTRACT

A PNPN semiconductor switch including an N type semiconductor substrate, spaced apart first and second P type diffused regions formed on a surface of an N type substrate, spaced apart first and second N type diffused regions formed in the second P type diffused region, a first gate insulating layer formed on the surface of the second P type diffused region between the first and second N type diffused regions to cover portions thereof, a first gate electrode formed on the first gate insulating layer between the first and second N type diffused regions, a resistance region disposed on the first gate insulating layer, one end of the resistance region on the side opposite to the first gate electrode, a second gate insulating layer overlying the first gate electrode and the resistance region, a semiinsulating layer formed on the surface of the substrate except over the first and second P type diffused regions, an insulating layer overlying the semiinsulating layer, a P gate electrode electrically connected to the second P type diffused region and the second N type diffused region, a second gate electrode formed on the second gate insulating layer at a portion above the first gate electrode, a cathode electrode connected to the first N type diffused region, an anode electrode connected to the first P type diffused region and the second gate electrode and a high resistance region formed immediately beneath the first gate insulating layer and between the first and second N type diffused regions.

1 Claim, 9 Drawing Figures

PRIOR ART
FIG_1A
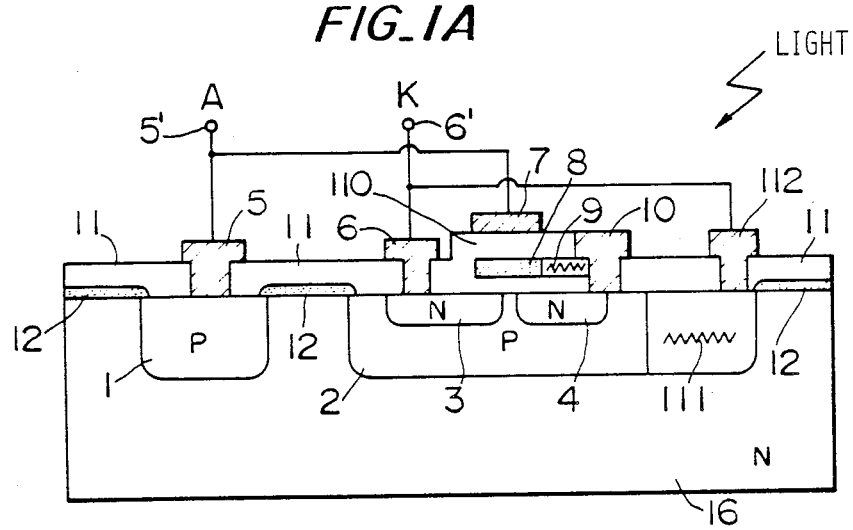
PRIOR ART
FIG_1B
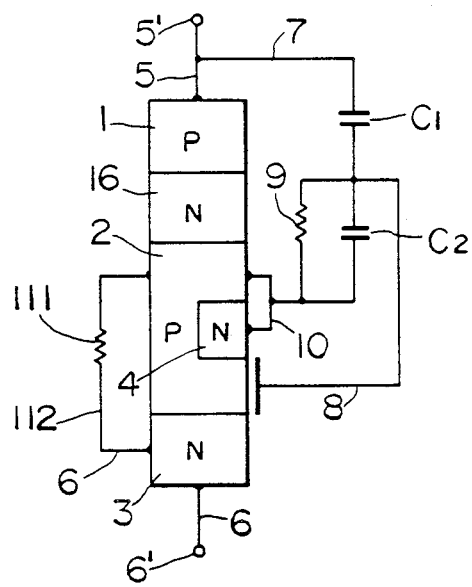

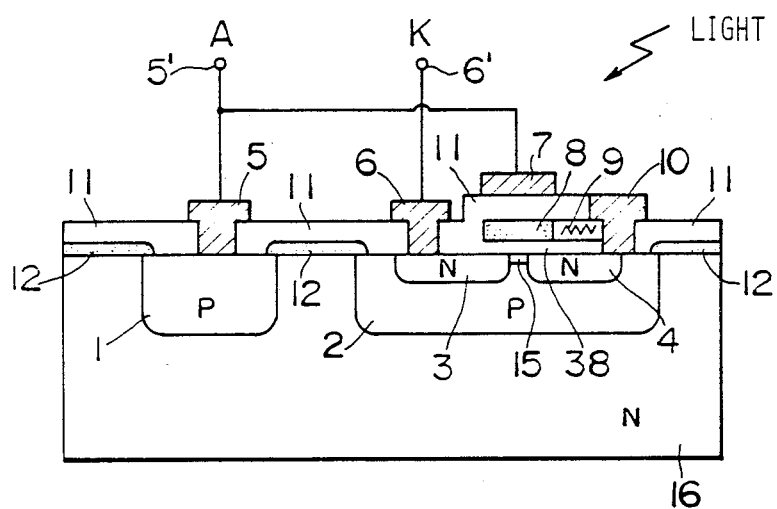
FIG_3
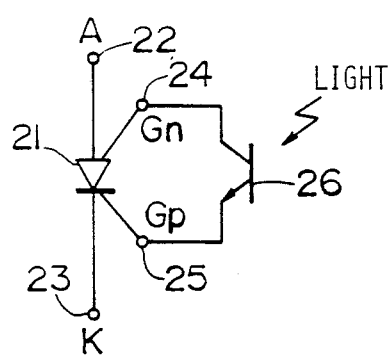
FIG_4
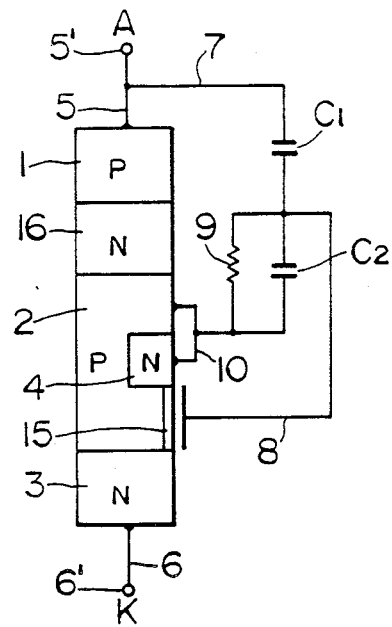
FIG_5

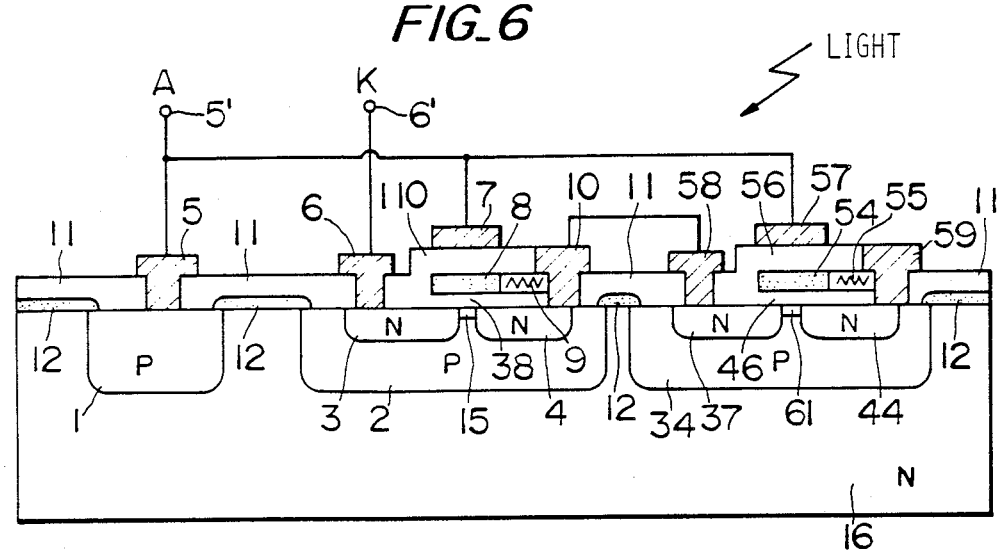
FIG_6
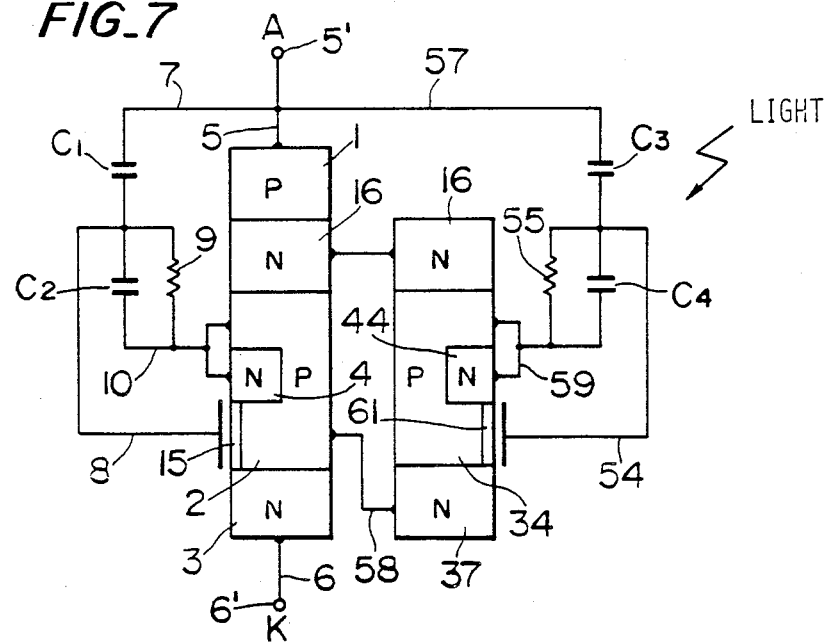
FIG_7

4,489,340

PNPN LIGHT SENSITIVE SEMICONDUCTOR SWITCH WITH PHOTOTRANSISTOR CONNECTED ACROSS INNER BASE REGIONS

BACKGROUND OF THE INVENTION

This invention relates to a PNPN semiconductor switch utilized as talking circuit switches of a telephone exchange or the like.

For the purpose of description, a prior art PNPN semiconductor switch will firstly be outlined with reference to FIGS. 1A and 1B of the accompanying drawings. The switch comprises a P type diffused region 1 acting as an anode region, a P type diffused region 2 acting as a P gate region, an N type diffused region 3 acting as a cathode region and the source region of an MOSFET, an N type diffused region 4 acting as the drain region of the MOSFET, an anode electrode 5, an anode terminal 5', a cathode electrode 6, a cathode terminal 6', a gate electrode 7 connected to have the same potential as the anode electrode 5, a polycrystalline silicon electrode 8 acting as the gate electrode of the MOSFET, a resistor 9 formed of the polycrystalline silicon electrode 8, a P gate electrode 10 interconnecting the diffused regions 2 and 4 and one end of the resistor 9, an N type substrate 16, a semiinsulating layer 12 disposed on the entire surface of the substrate 16 except over the P type diffused regions 1 and 2, and an insulating layer 11 disposed over the semiinsulating layer 12. A portion of the P type diffused region 2 forms a resistor 111 and an electrode 112 is provided to cause one end of the resistor 111 to have the same potential as the cathode electrode 6. A capacitor $C_1$ is formed between the gate electrode 7 and the polycrystalline silicon electrode 8, while a capacitor $C_2$ is formed between the polycrystalline silicon electrode 8 and the diffused regions 2, 3 and 4.

This PNPN semiconductor switch can prevent a misoperation when applied voltage builds up steeply, and can be formed as an integrated circuit which is driven by light. When the PNPN semiconductor switch is driven by current, the electrode 10 acts as a P gate electrode.

When a rapidly building up voltage which supplies a positive bias to the anode electrode 5 and a negative bias to the cathode electrode 6 is applied to this PNPN semiconductor switch, a transient current flows through a PN junction formed between the P type diffused region 2 and the N type substrate 16. However, since the potential of the polycrystalline silicon electrode 8 rises to a potential determined by the capacitances of the capacitors $C_1$ and $C_2$ at the same time that an input voltage is applied, electrons would forms an N channel between the N type diffused regions 3 and 4. Accordingly, the current generated at the PN junction and flowing through the P type diffused region 2 will flow toward the cathode electrode 6 via the P gate electrode 10, the N type diffused region 4, the N channel described above and the N type diffused region 3 with the result that the PNPN element constituted by the P type diffused region 1, the N type substrate 16, the P type diffused region 2 and the N type diffused region 3 does not act as a switching element and shows a high dv/dt capability.

Since it is possible to control the charge and discharge of the potential of the polycrystalline silicon electrode 8 with the resistor 9 and the capacitors $C_1$ and $C_2$, it is possible to cause the PNPN switching element to operate as described above only for an input voltage which builds up steeply but the switch does not operate as described above for a DC voltage or a low frequency input voltage supplied during normal operation. Thus, since the operating potential of the polycrystalline silicon electrode 8 is the same as that of the P type diffused region 2, to operate the PNPN element by light irradiation, the element must be operated at a photocurrent corresponding to the gate sensitivity determined by the resistor 111 formed in the P type diffused region 2.

However, there is a definite limit for the gate sensitivity of the PNPN element.

As shown in FIG. 1A, since the resistor 111 is formed by using a portion of the P type diffused region 2, it is impossible to make the resistance value of resistor 111 high. If the resistance value is increased, the capacitance at the PN junction formed between the resistor 111 and the N type substrate 16 increases, thus forming a new factor for generating a transient current with the result that it is impossible to increase the sensitivity. In other words, notwithstanding the increase in the capacitance, it is necessary to increase the size of the MOSFET in order to maintain a high dv/dt capability.

FIG. 2A shows still another prior art PNPN semiconductor switch and its equivalent circuit is shown in FIG. 2B. The PNPN semiconductor switch shown in FIGS. 2A and 2B has substantially the same construction as that shown in FIGS. 1A and 1B. More particularly, a polycrystalline silicon resistor 118 is formed on the righthand side of the gate electrode 10.

The PNPN semiconductor switch shown in FIGS. 2A and 2B also manifests a high dv/dt capability. The gate sensitivity is determined by the polycrystalline silicon resistor 118 instead of the resistor 111 shown in FIG. 1A. Since it is easy to make the resistance value of resistor 118 high, it is possible to improve the gate sensitivity.

With the PNPN semiconductor switch shown in FIG. 2A, since it is necessary to form the polycrystalline silicon resistor 118 on the P type diffused layer 2 the area thereof is increased so that the capacitance between the P type diffused region 2 and the N type substrate 16 increases, thus creating a large transient current. Consequently, in order to maintain a large dv/dt capability, it is necessary to provide a large MOSFET.

Although it is possible to form the polycrystalline silicon resistor 118 on the outside of the P type diffused region 2, a transient current would be created due to a capacitance between the wiring interconnecting the resistor 118 and the electrode 10 and interconnecting the semiinsulating layer 12 and the N type substrate 16 via the insulating layer 11 so that it is necessary to provide a large MOSFET for the purpose of maintaining a high dv/dt capability.

In addition, where the sensitivity of the PNPN semiconductor switches shown in FIGS. 1A and 2A is made too high, misoperation would result when a low peak voltage which is lower than the threshold voltage of the MOSFET but builds up sharply is applied. For this reason, there is a limit for the sensitivity.

For the purpose of increasing the gate sensitivity of a photo PNPN semiconductor switch, a circuit has been proposed in which a photo current is amplified by a phototransistor and then supplied to the gate electrode of the PNPN element. FIG. 4 shows one example of the simplest circuit comprising a PNPN element 21, an anode terminal 22, cathode terminal 23, a N gate terminal 24, a P gate terminal 25, and a phototransistor 26.

In this circuit, when a positive bias is applied to the anode terminal 22 and a negative bias is applied to the cathode terminal 23 and when light is irradiated upon the phototransistor 26, a current which is amplified by the phototransistor 26 flows into the P gate terminal of the PNPN element 21 from the anode terminal 22 through the N gate terminal 24, thus turning ON the PNPN switch 21. Accordingly, its gate sensitivity is high.

However, when a steeply building up voltage is impressed across the anode terminal 22 and a cathode terminal 23, a transistor current formed at the base junction of the NPN phototransistor 26 is greatly amplified by its amplifying function and then flows into the P gate terminal 25 of the PNPN element 21, thus greatly impairing the dv/dt capability of the switching element.

Even when the PNPN element 21 is replaced by the PNPN element which is shown in FIG. 1A and which has a large dv/dt capability, it is necessary to use a complicated PNPN element having an MOS construction capable of passing an extremely large transient current so as to prevent dv/dt misoperation.

SUMMARY OF THE INVENTION

Accordingly, it is an object of this invention to provide an improved PNPN semiconductor switch having a small size but capable of manifesting a high gate sensitivity and a high dv/dt capability.

According to this invention there is provided a PNPN semiconductor switch of the type comprising an N type semiconductor substrate, a first P type diffused region formed in the N type substrate, a second P type diffused region formed in the substrate at a predetermined distance spaced from the first P type diffused region formed in the second P type diffused region, a second N type diffused region formed in the second P type diffused region at a predetermined distance from the first N type diffused region, a first gate insulating layer formed on a surface of the second P type diffused region between the first and second N type diffused regions to cover portions thereof, a first gate electrode formed on the first gate insulating layer between the first and second N type diffused regions, a high resistance region disposed on the first gate insulating layer, one end of the high resistance region on the side opposite to the first gate electrode being electrically connected to the second P type diffused region or the first N type diffused region, a second gate insulating layer overlying the first gate electrode and the high resistance region, a semiinsulating layer formed on the surface of the substrate between the first and second P type diffused regions, an insulating layer overlying the semiinsulating layer, a P gate electrode electrically connected to the second P type diffused region and the second N type diffused region, a second gate electrode formed on the second gate insulating layer over the first gate electrode, a cathode electrode electrically connected to the first N type diffused region, and an anode electrode electrically connected to the first P type diffused region, characterized by a high resistance region formed immediately beneath the first gate insulating layer and between the first and second N type diffused regions.

BRIEF DESCRIPTION OF THE DRAWINGS

In the accompanying drawings:

FIG. 1A is a sectional view showing a prior art PNPN semiconductor switch;

FIG. 1B is an equivalent circuit of the PNPN semiconductor switch shown in FIG. 1A;

FIG. 3 is a sectional view showing one embodiment of the PNPN semiconductor switch according to the present invention;

FIG. 4 is a circuit in which photocurrent is amplified by a phototransistor and then applied to the gate electrode of the PNPN semiconductor switch shown in FIG. 3;

FIG. 5 is an equivalent circuit of the PNPN semiconductor switch shown in FIG. 3;

FIG. 6 is a sectional view of a modified PNPN semiconductor switch embodying the invention; and FIG. 7 is an equivalent circuit of the PNPN semiconductor switch shown in FIG. 6.

DESCRIPTION OF THE PREFERRED EMBODIMENTS

Figure 2A:
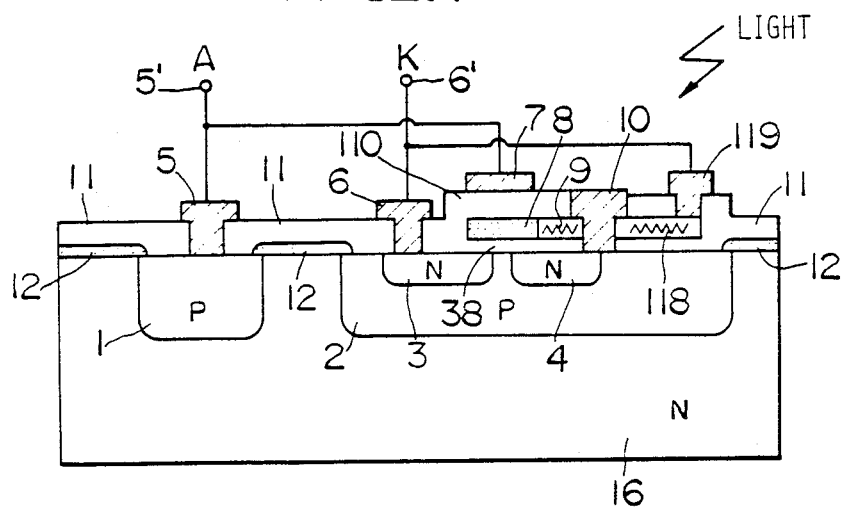
FIG. 2A is a sectional view showing another prior art PNPN semiconductor switch.
Figure 2B:
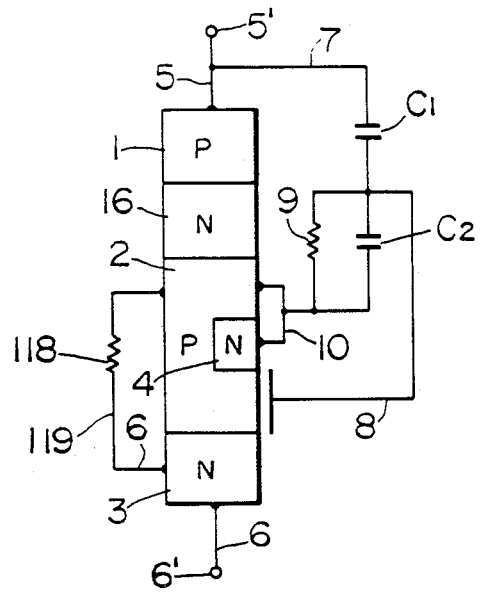
FIG. 2B is an equivalent circuit of the PNPN semiconductor switch shown in FIG. 2A.

The improved PNPN semiconductor switch or element shown in FIG. 3 and also in FIG. 5 as an equivalent circuit of FIG. 3, comprises an N type semiconductor substrate 16 acting as the gate region of the PNPN element and the collector region of a phototransistor and having a P type diffused region (i.e.—a first P type diffused region) 1 which is formed in a predetermined portion on the upper surface of the substrate 16 so as to act as the anode region. Furthermore, a P type diffused region 2 (i.e.—a second P type diffused region) acting as the P gate region is formed in the upper surface of the substrate 16 at a predetermined distance from the P type diffused region 1. An N type diffused region 3 (i.e.—a first N type diffused region) acting as a cathode region and the source region of an MOSFET is formed in the second P type diffused region 2. An N type diffused region 4 (i.e.—a second N type diffused region) at a predetermined distance is also formed in the region 2 from the N type diffused region 3 so as to act as the drain region of the MOSFET. A semiinsulating layer 12 is formed on selected portions of the surface of the N type substrate 16 formed with diffused regions 1, 2, 3, and 4 in a manner described above. An insulating layer 11 is formed over the semiinsulating layer 12. It is herein termed the insulating layer 38 disposed on the surface between the N type diffused regions 3 and 4 as a first gate insulating layer. An N type polycrystalline silicon electrode (a first gate electrode) 8 acting as the gate electrode of the MOSFET is formed on the first gate insulating layer 38 on the surface between the N type diffused regions 3 and 4. Similarly, an N type polycrystalline silicon resistor 9 (i.e.—a first resistance region) is formed on the first gate insulating layer 38 adjacent to the polycrystalline silicon electrode 8. A second gate insulating layer 110 is provided to overlie the polycrystalline electrode 8 and resistor 9. A gate electrode (i.e.—a second gate electrode) 7 is maintained at the same potential as an anode electrode to be described later is mounted on the second gate insulating layer 110 above the polycrystalline silicon electrode 8. The anode electrode 5 is connected to the P type diffused region 1 and provided with an anode terminal 5′. A cathode electrode 6 is mounted on the N type diffused region 3 and is provided with a cathode terminal 6′. Furthermore, a P gate electrode 10 is mounted on the N type diffused region 4 and the P type diffused region 2 and is electrically connected to the end of the resistor 9 opposite to the N crystalline silicon electrode 8.

According to this invention, a N type high resistance layer (i.e.—a first high resisance region) 15, having a low concentration of N type impurities, is provided immediately beneath the first gate insulating layer 38 and between the first and second N type diffused regions 3 and 4.

In the modification shown in FIG. 6 and also in FIG. 7 as an equivalent circuit of FIG. 6, an N type polycrystalline silicon electrode (i.e.—a third gate electrode) 54, acting as the gate electrode of the MOSFET is mounted on the third insulating layer 46 on the surface between a third and a fourth N type diffused regions 37 and 44 formed in a third P type diffused region 34. The third N type diffused region 37 acts as a source and emitter region, while the fourth N type diffused region 44 acts as a drain region. An N type polycrystalline silicon resistor (i.e.—a second resistance region) 55 is formed on the third gate insulating layer 46 contiguous to the polycrystalline silicon electrode 54, and a fourth gate insulating layer 56 is mounted on the polycrystalline silicon electrode 54 and the resistor 55. A gate electrode (i.e.—a fourth gate electrode) 57 is connected to the anode electrode 5 and is mounted on the fourth gate insulating layer 56 above the polycrystalline silicon electrode 54. An emitter electrode 58 is mounted on the N type diffused region 37 and electrically connected to the P gate electrode 10. A base electrode 59 is mounted on the N type diffused region 38 and the P type diffused layer 34, and is electrically connected to one end of the resistor 55 on the side opposite to the polycrystalline silicon electrode 54. An N type high resistance region (i.e.—a second high resistance region) 61 having a diffused low impurity concentration is formed immediately beneath the third gate insulating layer 46 and between the third and fourth N type diffused regions 37 and 44.

With the construction described above, a capacitor $C_1$ is formed between the gate electrode 7 and the polycrystalline silicon electrode 8, while a capacitor $C_2$ is formed between the polycrystalline silicon electrode 8 and the diffused regions 2, 3 and 4. Furthermore, a capacitor $C_3$ is formed between the gate electrode 57 and the polycrystalline silicon electrode 54, while a capacitor $C_4$ is formed between the polycrystalline silicon electrode 54 and the diffused regions 34, 37 and 44.

The semiinsulating layer 12 is provided for the purpose of preventing punchthrough between the P type diffused region 1 and the P type diffused regions 2 and 34 due to the influence of the potential of the surface wiring interconnecting the anode electrode 5 and the gate electrodes 7 and 57. If the resistance value of the above semiinsulating layers 12 is $1 \times 10^6 - 10^7$, for example, its purpose can be accomplished.

The PNPN semiconductor switch constructed as described above has a high gate sensitivity and a high dv/dt capability when driven by a phototransistor. When the base electrode 59 is coupled to a base terminal, (not shown), this switch acts as a PNPN semiconductor switch driven by a current transistor. However, for the purpose of brevity, the following description will be made only in the case where the PNPN semiconductor switch is driven by light.

In the absence of light, when a steeply building up voltage is impressed so as to positively bias the anode electrode 5 and negatively bias the cathode electrode 6, transient currents flow through the PN junctions between the P type diffused region 2 and the N type substrate 16 and between the P type diffused region 34 and the N type substrate 16 and the potential of the polycrystalline silicon electrode 8 rises to a magnitude determined by the capacitances of the capacitors $C_1$ and $C_2$ due to the input applied voltage, so that electrons would accumulate in the N type high resistance region 15, thus decreasing its resistance value. The potential of the polycrystalline silicon electrode 54 also rises to a magnitude determined by the capacitances of the capacitors $C_3$ and $C_4$ with the result that electrons accumulate in the N type high resistance region 61, thus decreasing its resistance value. Accordingly, the transient current generated between the P type diffused region 2 and the N type substrate 16 flows to the cathode electrode 6 via the P type diffused region 2, the P gate electrode 10, the second N type diffused region 4, the N type high resistance region 15 and N type diffused region. The transient current generated between the P type diffused region 34 and the N type substrate 16 flows to the cathode electrode 6 via P type diffused region 34, the base electrode 59, the N type diffused region 44, the N type high resistance region 61, the N type diffused region 37, the emitter and P gate electrodes 58 and electrode 10, N type diffused region 4, N type high resistance region 15, and the N type diffused region 3. For this reason, under these conditions, the PNPN semiconductor switch does not misoperate, thus showing a high dv/dt capability.

The time constants of the rising and the lowering of the potentials of the polycrystalline silicon electrodes 8 and 54 are determined by the values of resistor 9 and capacitors $C_1$ and $C_2$ and the values of resistor 55 and capacitors $C_3$ and $C_4$ respectively, so that it is possible to preset them such that the PNPN semiconductor switch can operate as described above only when a steeply building up voltage is impressed. Accordingly, when a direct current voltage or a low frequency AC voltage is applied across the anode and cathode electrodes 5 and 6, the potentials of the polycrystalline silicon electrodes 8 and 54 do not rise and are maintained at the same potentials as the P type diffused regions 2 and 34 so that the resistance values of the N type high resistance regions 15 and 61 remain at the initial values. Consequently, when light is irradiated upon the PNPN semiconductor switch with a positive bias applied to the anode terminal 5' and a negative bias to the cathode terminal 6', a phototransistor utilizing the N type substrate 16 as the collector electrode, the P type diffused region 34 as the base electrode, and the N type diffused region 37 as the emitter electrode 58 is rendered operative to supply amplified current from the anode electrode 5 to the P type diffused region 2 through the P type diffused region 1, N type substrate 16, the P type diffused region 34, the N type diffused region 37 and the emitter and P gate electrodes 58 and 10. When this current has a sufficient magnitude to assure a switching sensitivity determined by the resistance of the N type high resistance region 15 corresponding to the resistance between the P gate and cathode electrodes 10 and 6 of a PNPN switching element constituted by P type diffused region 1, N type substrate 16, P type diffused region 2 and N type diffused region 3, the PNPN element is turned on. At this time, although the resistance of the N type high resistance region 61 is inserted between the base and emitter electrodes of the phototransistor, the effect thereof can be alleviated by selecting an extremely large initial value for the resistance of the N type high resistance region 61.

Some concrete data will be given in the following: Assume now that a clamp voltage having a steep build-up time of 0.1 μs to several μs, and a value of up to 300 V after building-up is impressed upon the PNPN semiconductor switching element. Under these conditions, when the circuit constants are selected such that the ratio of the capacitances of the capacitors $C_2$ and $C_1$, and the ratio of the capacitances of the capacitors $C_3$ and $C_4$ are both about 10, the product of the values of the resistor 9 and the capacitor $C_2$, and the product of the values of the resistor 55 and the capacitor $C_3$ provide a time constant equal to or slightly larger than the steep build-up time of the voltage (for example, the resistors 9 and 55 have a value of 1 megohm to 10 megohms, and the capacitors $C_1$ and $C_3$ have a capacitance of 0.1 pF to 1 pF), the potentials of the polycrystalline silicon electrodes 8 and 54 rise to a voltage obtained by dividing the applied voltage by the ratio of the values of capacitors $C_2$ and $C_1$ and capacitors $C_3$ and $C_4$ (about 1/10 of the applied voltage), whereby electrons accumulate in the N type high resistance regions 15 and 61 to decrease the resistance values thereof. The value of each of the N type high resistance regions 15 and 61 is made to be from several hundred ohms to several megohms which represents the value of the high resistance formed by implanting an N type impurity into the surface of the P type diffused regions 2 and 34 respectively so as to slightly invert the conductivity type thereof from P type to N type. The resistances of the N type high resistance regions 15 and 61 readily decrease in response to the rise in the potential due to the electron accumulating effect of the polycrystalline silicon electrodes 8 and 54 caused by the potential rise thereof, for example to several tens ohms when the applied voltage is 300 V. Consequently, the base-emitter voltage of the phototransistor and the P gate-cathode voltage of the PNPN element are positively clamped so that even when a steeply building-up voltage is applied, the transient current of the phototransistor would not be amplified and the PNPN element would not be turned-on.

During the normal operation, when the time constants determined by the product of the values of the resistor 9 and the capacitor $C_1$, and the time constants determined by the product of the values of the resistor 55 and the capacitor $C_3$ are both about several μs as described above, and when the input signal is an AC signal having a frequency of less than several tens KHz, or a DC voltage, the potentials of the polycrystalline silicon electrodes 8 and 54 would not rise so that the sensitivity would be determined by the photosensitivity of the phototransistor. Consequently, even a photocurrent that does not clamp the base-emitter voltage of the phototransistor, in this case a photocurrent of less than about 1 μA, is amplified to from several to several tens μA by the current amplifying function of the phototransistor and then supplied to the P gate electrode of the PNPN element, thus turning on the same.

Although in the foregoing embodiment, the gate electrodes 7 and 57 were made to have the same potential as the anode electrode 5, the same advantageous effect can be realized even when the gate electrodes 7 and 57 are connected so as to have the same potential as the N type substrate 16. Furthermore, although the ends of the resistors 9 and 55 on the sides opposite to the polycrystalline silicon electrodes 8 and 54 were electrically connected to the diffused regions 2 and 4 and 34 and 44 through electrodes 10 and 59 respectively, it should be understood that the resistors 9 and 55 may be electrically connected to the N type diffused regions 3 and 37 to accomplish the same result. It is also possible to form two sets of the PNPN semiconductor switches on the same N type substrate 16 and to connect in parallel opposition these switches to provide a bidirectional switch.

Although in this embodiment, the collector electrode of the phototransistor was constituted by the N type substrate 16 of the PNPN element, the phototransistor may be isolated from the PNPN element to make the collector electrode have the same potential as the anode electrode of the PNPN element.

Where a phototransistor (which may be a current driven transistor) is driven by a method in which a bidirectional PNPN element with a single phototransistor is combined with a diode bridge with its elements isolated, it is possible to derive a large current from the anode electrode of the PNPN element and to apply the current to the gate electrode of the PNPN element so as to improve the sensitivity thereof. When the transistor is constructed as shown in the foregoing embodiment, that is, constituted by an MOS structure formed in the base region, a resistance layer controlled by the MOS structure, and control means constituted by a resistor and a capacitor for controlling the base-emitter impedance, it is possible to prevent the amplifying of the transient current. Although a PNPN semiconductor switch utilizing the prior art circuit has a high gate sensitivity, its dv/dt capability is poor. But the use of the transistor structure described above provides a PNPN semiconductor switch having a high dv/dt capability and a high gate sensitivity.

In the foregoing embodiment, the transistor utilized to supply current to a gate electrode from an anode electrode may be replaced by a PNPN element in which case, when utilizing an MOS construction, a resistance layer controlled thereby, and same means comprising a resistor and a capacitor for preventing turning on caused by a transient voltage are connected between the gate and cathode electrodes, the PHPN semiconductor switch has a high dv/dt capability and a high gate sensitivity.

In the embodiment described above, since an MOS structure formed in a base region, a high resistance region controlled thereby, and same means comprising a resistor and capacitor for controlling the base-emitter impedance are provided for a phototransistor which drives a PNPN element, notwithstanding the fact that the PNPN element is driven by the phototransistor, when a steeply building up voltage is applied, a transient current created in the base electrode of the phototransistor is not amplified, so that only the base transient current flows into the gate electrode of the PNPN element. Thus, even when this base transient current is superimposed upon a transient current created in the PNPN element, the resultant transient current is sufficiently small. Accordingly, even when an MOSFET utilized to prevent similar misoperation of the PNPN element is small, the adverse effect of the transient current can be minimized, thereby improving the dv/dt capability. Moreover, since the phototransistor can be formed on the same substrate with the same process steps as the PNPN element, it is easy to fabricate them into an integrated circuit. Moreover, since the PNPN element is driven by the phototransistor, where the resistance value of the high resistance region in the PNPN element is made extremely high so as to make the switching sensitivity of the PNPN switching element to be the highest possible value as determined by the construction of the PNPN element, the photocurrent of the phototransistor necessary to drive the PNPN semiconductor switch becomes very small, thus greatly improving the gate sensitivity of the PNPN semiconductor switch. Such a PNPN semiconductor switch is suitable for use not only as a telephone exchange talking line switch but also in many other fields.

What is claimed is:

1. In a PNPN semiconductor switch of the type comprising:
    an N type semiconductor substrate;
    a first P type diffused region formed in said substrate;
    a second P type diffused region formed in said substrate so as to be spaced apart from said first P type diffused region by a predetermined distance;
    a first N type diffused region formed in said second P type diffused region;
    a second N type diffused region formed in said second P type diffused region so as to be spaced apart from said first N type diffused region by a predetermined distance;
    a first gate insulating layer formed on a surface of said second P type diffused region between said first and second N type diffused regions;
    a P type gate electrode electrically connected to said second P type diffused region and said second N type diffused region;
    a first gate electrode of an N type polycrystalline silicon formed on a surface of said first gate insulating layer between said first and second N type diffused regions;
    a first resistance region of an N type polycrystalline silicon formed so as to extend from said first gate electrode to said P type gate electrode;
    a second gate insulating layer overlying said first gate electrode;
    a semiinsulating layer formed on a surface of said substrate except over said first and second P type diffused regions;
    an insulating layer overlying said semiinsulating layer;
    a second gate electrode formed on a surface of said second insulating layer over said first gate electrode;
    a cathode electrode electrically connected to said first N type diffused region;
    and an anode electrode electrically connected to said first P type diffused region and to said second gate electrode;
    the improvement which comprises a high resistance region having a low N type impurity concentration formed immediately beneath said first gate insulating layer and between said first and second N type diffused regions, said high resistance region acting a shunt resistor so as to thereby provide a high gate sensitivity for said PNPN semiconductor switch; and further comprising a phototransistor for amplifying a collector current caused by being exposed to light, wherein said phototransistor comprises:
    a third P type diffused region formed in said substrate so as to be spaced from said second P type diffused region by a predetermined distance;
    a third N type diffused region formed in said third P type diffused region;
    a fourth N type diffused region formed in said third P type diffused region so as to be spaced from said third N type diffused region by a predetermined distance;
    a third gate insulating layer formed on a surface of said third P type diffused region between said third and fourth N type diffused regions;
    a third gate electrode of an N type polycrystalline silicon formed on a surface of said third gate insulating layer between said third and fourth N type diffused regions;
    a base electrode electrically connected to said fourth N type diffused region and said third P type diffused region;
    a second resistance region of an N type polycrystalline silicon formed so as to extend from said third gate electrode to said base electrode;
    a semiinsulating layer formed on a surface of said substrate except over said second and third P type regions;
    an emitter electrode electrically connected to said third N type diffused region and to said P gate electrode;
    a fourth gate insulating layer formed on a surface of said third gate electrode;
    a fourth gate electrode disposed on a surface of said fourth gate insulating layer over said third gate electrode and electrically connected to said anode electrode;
    and another high resistance region having a low N type impurity concentration formed immediately beneath said third gate insulating layer and between said third and fourth N type diffused regions.

* * * * *